United States Patent
Peng et al.

(10) Patent No.: US 9,521,765 B2
(45) Date of Patent: Dec. 13, 2016

(54) FLOW-GUIDING APPARATUS AND ELECTRONIC DEVICE INCLUDING THE FLOW-GUIDING APPARATUS

(71) Applicant: Huawei Technologies Co., Ltd., Shenzhen (CN)

(72) Inventors: Yaofeng Peng, Hangzhou (CN); Chengpeng Yang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 491 days.

(21) Appl. No.: 13/685,396

(22) Filed: Nov. 26, 2012

(65) Prior Publication Data

US 2013/0324025 A1    Dec. 5, 2013

(30) Foreign Application Priority Data

Nov. 24, 2011 (CN) .......................... 2011 1 0378115

(51) Int. Cl.
| | |
|---|---|
| *H05K 5/00* | (2006.01) |
| *H05K 5/02* | (2006.01) |
| *G06F 1/20* | (2006.01) |
| *H05K 7/20* | (2006.01) |

(52) U.S. Cl.
CPC .............. *H05K 5/0213* (2013.01); *G06F 1/20* (2013.01); *H05K 7/20172* (2013.01)

(58) Field of Classification Search
CPC ............................. F04D 25/14; H05K 7/2019
USPC .......................... 454/184, 353, 259, 359, 127
See application file for complete search history.

(56) References Cited

U.S. PATENT DOCUMENTS

| | | | | |
|---|---|---|---|---|
| 5,793,608 A | * | 8/1998 | Winick et al. | ................. 361/695 |
| 6,135,875 A | * | 10/2000 | French | ................... H02B 1/565 |
| | | | | 361/695 |
| 6,554,698 B2 | * | 4/2003 | Kranzdorf et al. | ........... 454/184 |

(Continued)

FOREIGN PATENT DOCUMENTS

| | | |
|---|---|---|
| CN | 2547924 Y | 4/2003 |
| CN | 2651481 Y | 10/2004 |

(Continued)

OTHER PUBLICATIONS

International Search Report issued in corresponding PCT Patent Application No. PCT/CN2012/078730, mailed Oct. 18, 2012.

*Primary Examiner* — Avinash Savani
*Assistant Examiner* — Vivek Shirsat
(74) *Attorney, Agent, or Firm* — Brinks Gilson & Lione

(57) ABSTRACT

The present invention is applicable to the technical field of heat-radiation structures and discloses a flow-guiding apparatus and an electronic device including the flow-guiding apparatus. The flow-guiding apparatus includes a support and flow-guiding members for guiding an air flow generated by an axial fan to a directed area, where the flow-guiding members are connected to the support, at least two flow-guiding members are arranged and are located on both sides of a hub of the axial fan or around the hub of the axial fan, and the flow-guiding members tilt toward the hub of the axial fan along an air-blowing direction of the axial fan. The electronic device includes a chassis, where the chassis is provided with an air vent, an axial fan is arranged at the air vent, and an air outlet of the axial fan is arranged with a flow-guiding apparatus mentioned above.

15 Claims, 3 Drawing Sheets

(56) References Cited

U.S. PATENT DOCUMENTS

| | | | |
|---|---|---|---|
| 7,025,086 B2* | 4/2006 | Maeda | F04D 25/14 |
| | | | 137/512.1 |
| 8,007,228 B2* | 8/2011 | Wang | 415/146 |
| 2003/0012646 A1 | 1/2003 | Liao et al. | |
| 2005/0186070 A1 | 8/2005 | Zeng et al. | |
| 2008/0310103 A1* | 12/2008 | Della Fiora et al. | 361/690 |

FOREIGN PATENT DOCUMENTS

| | | |
|---|---|---|
| CN | 1580583 A | 2/2005 |
| CN | 2816433 Y | 9/2006 |
| CN | 201546980 U | 8/2010 |
| CN | 102523721 A | 6/2012 |
| TW | M259469 U | 3/2005 |
| WO | WO 2005/081979 A2 | 9/2005 |

* cited by examiner

FLOW-GUIDING APPARATUS AND ELECTRONIC DEVICE INCLUDING THE FLOW-GUIDING APPARATUS

CROSS-REFERENCE TO RELATED APPLICATION

This application claims priority to Chinese Patent Application No. 201110378115.0, filed on Nov. 24, 2011, which is hereby incorporated by reference in its entirety.

FIELD OF THE INVENTION

The present invention relates to the technical field of heat-radiation structures, and in particular, to a flow-guiding apparatus and an electronic device including the flow-guiding apparatus.

BACKGROUND OF THE INVENTION

As shown in FIG. 1, an existing axial fan 900 (the axial fan is a fan in which air comes out along the axial direction of a shaft of the fan) propels the air flow out by rotation of blades 920, where the direction of the air flow is parallel to a rotating axis. The air flow speed becomes higher and higher, approaching top areas of the blades 920; the air flow speed becomes lower and lower, approaching an area of a hub 910 (that is, bottom parts of the blades); and the air flow speed is zero at the hub 910, thereby forming an air flow dead area. As a result, the air flow speed in a certain area down the hub 910 is very small, and it is very difficult for components in the downstream area of the hub 910 to radiate heat; while the air flow rate in an area at edges of the blades 920 is obviously too high and exceeds the air flow rate required for components in the area, resulting in that the air flows non-uniformly from an air blowing section of the whole axial fan 900. A common method to address the problem is keeping the downstream components of the hub 910 a specific distance away from the hub 910, where the distance is normally at least the diameter of the hub 910, thereby forming a pressure-balancing chamber, so that the air flow is fully mixed within a space of the pressure-balancing chamber to eliminate impacts of the hub 910 on the air flow. However, the effect is unsatisfactory. Nevertheless, in some scenarios such as for a server, a system structure is very compact, and an axial fan 900 is quite close to downstream components, so that no sufficient pressure-balancing space is available, resulting in that air flow distribution is seriously non-uniform, the air flow rate in an area down a hub 910 is obviously insufficient, and it is very difficult to radiate heat in this area, thereby causing a harmful phenomenon of overheating, affecting the working stability of devices, and shortening the service life of the devices.

SUMMARY OF THE INVENTION

The present invention is intended to overcome the shortcoming of the prior art, and provides a flow-guiding apparatus and an electronic device including the flow-guiding apparatus which are capable of meeting design requirements of electronic devices having compact structures and preventing components and circuit boards from partially overheating, thereby ensuring the reliability of the device and prolonging the service life of the device.

A technical solution of the present invention is a flow-guiding apparatus arranged at an air outlet of an axial fan, where the flow-guiding apparatus includes a support and flow-guiding members for guiding an air flow generated by the axial fan to a directed area, the flow-guiding members are connected to the support, at least two flow-guiding members are arranged and are located on both sides of a hub of the axial fan or around the hub of the axial fan, and the flow-guiding members tilt toward the hub of the axial fan along an air-blowing direction of the axial fan.

The present invention further provides an electronic device including a chassis, where the chassis is provided with an air vent, an axial fan is arranged at the air vent, and an air outlet of the axial fan is arranged with the flow-guiding apparatus mentioned above.

A flow-guiding apparatus and an electronic device including the flow-guiding apparatus provided by the present invention, by arranging flow-guiding members connected to a support, where the flow-guiding members tilt toward a hub of an axial fan to guide an air flow from an area with a high air flow rate to an area with a low air flow rate, make the air flow of the whole air blowing section be uniform, eliminate an air flow dead area down the hub of the axial fan, eliminate radiating risks for components in the area down the hub, and improve the reliability and the service life of the device. In addition, since no pressure-balancing chamber is arranged, a product structure may be compact.

DETAILED DESCRIPTION OF THE EMBODIMENTS

To make the objective, technical solutions, and advantages of the present invention more comprehensible, the following describes the present invention in further detail with reference to the accompanying drawings and embodiments. It is understandable that the specific embodiments described herein are only used to explain the present invention and are not intended to limit the present invention.

Embodiment 1

Figure 1:
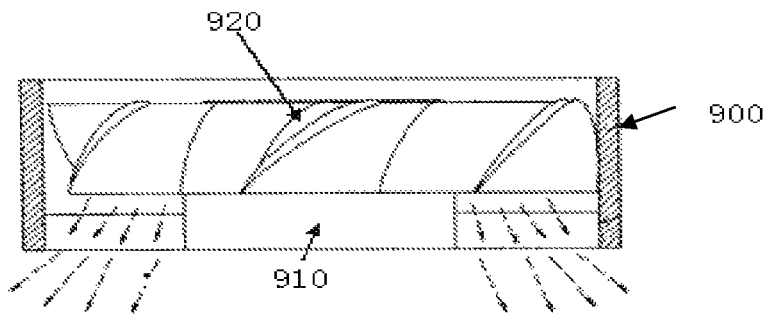
FIG. 1 is a schematic sectional view of an axial fan in the prior art.
Figure 2:
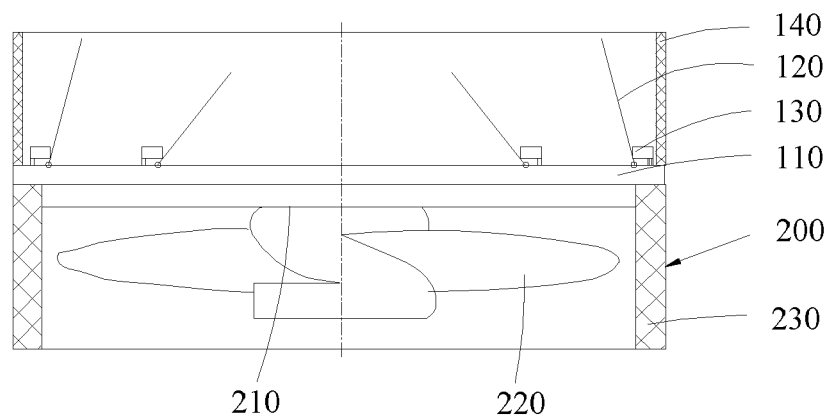
FIG. 2 is a schematic sectional view for assembling a flow-guiding apparatus according to a first embodiment of the present invention with an axial fan.

As shown in FIG. 2, an embodiment of the present invention provides a flow-guiding apparatus which is arranged at an air outlet of an axial fan 200. The axial fan 200 includes a casing 230 and a rotating hub 210 arranged inside the casing 230, where blades 220 are fixedly arranged on an outer sidewall of the hub 210.

As shown in FIG. 2, the flow-guiding apparatus includes a support 110 and flow-guiding members 120 for guiding an air flow generated by the axial fan 200 to a directed area. In this embodiment, the flow-guiding members 120 are in a shape of a sheet. The flow-guiding members 120 are connected to the support 110. At least two flow-guiding members 120 are arranged and are located on both sides of the hub 210 of the axial fan 200 or around the hub 210 of the axial fan 200. The flow-guiding members 120 tilt toward the hub 210 (a central area of the axial fan 200) of the axial fan 200 along an air-blowing direction of the axial fan 200, so that the air flow generated by the axial fan 200 is guided by the flow-guiding members 120 to the central area where the original air flow speed is very small, thereby making the air flow from the air blowing section of the whole axial fan 200 be uniformly distributed for excellent heat radiation of components corresponding to the air blowing section of the whole axial fan 200, which overcomes the shortcoming of the prior art. Moreover, because no space for forming a pressure-balancing chamber is required, the distance between the axial fan 200 and components requiring heat radiation is set small enough to meet design requirements of an electronic device with a compact structure. By using the flow-guiding apparatus provided by the embodiment of the present invention, the air flow generated at the blades 220 of the axial fan 200 may be guided to an area of the hub 210 of the axial fan 200 where the original air flow is weak, so that the air flow is uniform in the whole air blowing section, thereby eliminating an air flow dead area in an area down the hub 210 of the axial fan 200, ensuring the heat-radiating performance in the area of the hub 210, preventing the components and a circuit board from partially overheating, further ensuring the working stability of a device, prolonging the service life of the device, reducing a pressure-balancing space between the axial fan 200 and downstream components, and making the whole system more compact.

Specifically, along a radial direction of the axial fan 200, at least two flow-guiding members 120 are arranged, and an opening angle of flow-guiding members 120 with a short distance from the hub 210 of the axial fan 200 is smaller than an opening angle (that is, a tilt angle) of flow-guiding members with a long distance from the hub 210 of the axial fan 200. Tilt angles of flow-guiding members 120 located in different radial directions are different (in this embodiment, a tilt angle refers to an angle between a flow-guiding member 120 and the support 110), and tilt angles of flow-guiding members 120 close to the hub 210 are smaller than tilt angles of flow-guiding members 120 far away from the hub 210. For the axial fan 200, the air flow in an area approaching the hub 210 in the center becomes smaller and smaller, and the air flow in an area approaching tips of the blades 220 becomes bigger and bigger. Flow-guiding members 120 far away from the central area may guide the corresponding air flow to an area directed by the flow-guiding members 120 when the tilt angles thereof are big, and flow-guiding members 120 close to the central area may guide the corresponding air flow to the central area only when the tilt angles thereof are small. The tilt angles of flow-guiding members 120 close to the hub 210 are set small, so that the air flow of the air blowing section of the whole axial fan 200 is uniformly distributed.

In this embodiment, two flow-guiding members 120 are respectively arranged on the left side and on the right side of the hub 210, all the flow-guiding members 120 are arranged symmetrically about the hub 210; two flow-guiding members 210 are close to tip ends of the blades 220 of the axial fan 200, another two flow-guiding members 120 are close to middle parts of the blades 220 of the axial fan 200; an opening angle of the flow-guiding members 120 close to the tip ends of the blades 220 of the axial fan 200 ranges between 70° and 90°, and an opening angle of the flow-guiding members close to the middle parts of the blades 220 of the axial fan 200 ranges between 30° and 65°, thereby enabling the air to flow uniformly from the whole air blowing section of the axial fan 200.

Specifically, the flow-guiding members 120 are movably hinged to the support 110 and may flip open by action of the axial fan 200. The support 110 may be integrated on an end surface of the casing 230 of the axial fan 200, and such a case is equivalent to that the flow-guiding members 120 are directly hinged on the casing 230 of the axial fan 200. Assuredly, the support 110 may also be fitted on the casing 230 of the axial fan 200 by using fasteners, which also falls within the protection scope of the present invention. The flow-guiding members 120 or the support 110 are arranged with limiting mechanisms for limiting a maximum turnover angle of the flow-guiding members 120. A shape and size of the support 110 match a shape and size of the axial fan 200, and the central area of the axial fan 200 overlaps the central area of the support 110. During operation, the axial fan 200 generates an air flow which flows forward along an axial direction of a shaft of the fan; the flow-guiding members 120 flips forward to open by action of the air flow; the limiting mechanisms may limit a maximum turnover angle of the flow-guiding members 120. By arranging the limiting mechanisms in proper positions, the flow-guiding members 120 tilt in a specific angle against the direction of the air flow after turning over to the maximum angle, thereby guiding the air flow to a direction directed by the flow-guiding members 120. In this embodiment, the flow-guiding members 120 are arranged on both sides of a central axis of the axial fan 200, and after turning over to the maximum angle, the flow-guiding members 120 all tilt toward the area of the hub 210 (that is, the central area of the axial fan 200). When the axial fan 200 stops working, because no air flow reaches the flow-guiding members 120 and by action of air pressure inside the device, the flow-guiding members 120 may flip backward and touch the support 110 or the hub 210 of the axial fan 200 to block the air blowing section of the axial fan 200. When two or more axial fans 200 are arranged side by side, if one of the axial fans 200 fails and stops rotating and the air blowing section is not closed, the air flow of other axial fans 200 directly flows out through the air blowing section of the failed axial fan 200, which forms an air flow short pass and seriously affects the heat-radiating effect of the device. In the flow-guiding apparatus provided by the embodiment of the present invention, by hinging the flow-guiding members 120 to the support 110, the air blowing section may be closed when the axial fan 200 stops rotating, which has a function of avoiding the air flow short pass, thereby preventing a harmful phenomenon of device overheating due to the formation of the air flow short pass, and further ensuring the working reliability of the device.

Alternatively, the flow-guiding members 120 may also be fixedly arranged on or integrated with the support 110, which also has a function of guiding the air flow but cannot prevent the air flow short pass.

Specifically, as shown in FIG. 2, the flow-guiding members 120 are hinged around the central area or on both sides of the central area of the support 110. When the flow-guiding members 120 flip to the maximum turnover angle, the flow-guiding members 120 tilt toward the central area of the support 110 to guide an air flow generated at the area of the blades 220 of the axial fan 200 to the area of the hub 210 of the axial fan 200 where the air flow is weak. In this embodiment, the flow-guiding members 120 are hinged on both sides of the central area, the flow-guiding members 120 on the left side tilt toward the right, and the flow-guiding members 120 on the right side tilt toward the left, hinge points between the flow-guiding members 120 and the support 110 correspond to middle parts of the blades 220 of the axial fan 200, the flow-guiding members 120 on the two sides may be arranged symmetrically or asymmetrically, and maximum turnover angles of the flow-guiding members 120 in different positions on the two sides may be same or different, which may be flexibly set according to positions and air flow requirements of the downstream components.

Specifically, as shown in FIG. 2, along a radial direction of the support 110, at least two flow-guiding members 120 are arranged, and correspondingly, at least two limiting mechanisms are arranged. The flow-guiding members 120 and the limiting mechanisms may be determined according to actual situations, which shall all fall within the protection scope of the present invention. If components requiring heat radiation are concentrated in an area to the right of the air outlet of the axial fan, both the opening angle of the flow-guiding members 120 and the number of the flow-guiding members 120 on the left side may be decreased, while the opening angle and the number of the flow-guiding members 120 on the right side may be increased, and vice versa. The maximum turnover angle of the flow-guiding members 120 close to the central area of the support 110 is smaller than the maximum turnover angle of the flow-guiding members 120 with a long distance from the central area of the support 110.

Specifically, as shown in FIG. 2, the limiting mechanisms include limiting bosses 130, where the limiting bosses 130 are fixedly arranged on the support 110 or at bottom parts of the flow-guiding members 120, both of which may have a function of limiting maximum turnover angles of the flow-guiding members 120. The limiting bosses 130 may be arranged on and protrude from the support 110 or be arranged on and protrude from the bottom parts of the flow-guiding members 120 to reduce assembly steps, and may also be assembled and fixed on the support 110 or be fixed on the bottom parts of the flow-guiding members 120. In this embodiment, the limiting bosses 130 are fixedly arranged on the support 110.

Preferably, as shown in FIG. 2, the limiting bosses 130 are made of elastic materials to prevent noise when the flow-guiding members 120 hit the limiting bosses 130 when the flow-guiding members 120 are opened or when the air flow is unstable. In specific applications, the limiting bosses 130 may be made of elastic materials such as rubber. Assuredly, it may be understood that the limiting bosses 130 may also be made of other materials, and may also be integrated with the support 110, both of which fall within the protection scope of the present invention.

In addition, the limiting mechanisms may be in other proper structures. For example, catch rings for stopping the flow-guiding members 120 may be arranged, or ropes for limiting turnover of the flow-guiding members 120 may be arranged, both of which may implement the position-limiting function.

Further, as shown in FIG. 2, the support 110 is further arranged with a flow-guiding frame 140, where the flow-guiding frame 140 encloses the flow-guiding members 120 to facilitate improving the heat-radiating performance. The flow-guiding frame 140 may be fixedly connected to the support 110 or be integrally molded with the support 110 by using plastic.

Specifically, as shown in FIG. 2, the support 110 is fixedly connected to an end surface of the casing 230 or is integrated with the casing 230. If the support 110 and the casing 230 are integrated, the flow-guiding members 120 may be hinged on the axial fan 200. In such cases, the flow-guiding apparatus may be integrated with the axial fan 200 to produce a high product integration level. In addition, the support 110 may also be shaped separately and be assembled with parts such as the flow-guiding members 120 and position-limiting blocks, and be fixed in an air-blowing direction of the axial fan 200 by using fasteners such as bolts, which all fall within the protection scope of the present invention.

Embodiments of the present invention further provide an electronic device, where the electronic device may be a computer, a notebook computer, a mobile portable electronic terminal, a computer server, an on-vehicle electronic device, and a communication device. The electronic device includes a chassis, where electronic components and circuit boards are arranged inside the chassis. The chassis is provided with the air vent, an axial fan 200 is arranged at the air vent, and an air outlet of the axial fan 200 is arranged with a flow-guiding apparatus mentioned above. One, two, or more axial fans 200 may be arranged, and correspondingly, one, two, or more flow-guiding apparatuses may be arranged. In this embodiment, the flow-guiding members 120 are arranged on both sides of a central axis of the axial fan 200, all the flow-guiding members tilt toward the central axis of the axial fan 200, and the flow-guiding members 120 are capable of guiding a strong air flow generated by blades 220 of the axial fan 200 to an area of a hub 210 of the axial fan 200 where the original air flow is weak, thereby ensuring the heat-radiating performance of the area of the hub 210 of the axial fan 200, preventing the components and the circuit boards inside the electronic device from partially overheating, further ensuring the working stability of the electronic device, and prolonging the service life of the electronic device. When the axial fan 200 stops working, because no air flow reaches the flow-guiding members 120 and by action of air pressure inside the chassis, the flow-guiding members 120 may automatically return to original positions and touch the axial fan 200 to close an air blowing section of the axial fan 200, thereby preventing the formation of an air flow short pass. In addition, when the electronic device is powered off, the axial fan 200 also stops rotating. In such cases, the flow-guiding members 120 will be timely closed to block the air blowing section of the axial fan 200, which prevents foreign matters from entering the electronic device and produces a high reliability.

Embodiment 2

As shown in FIG. 2, another embodiment of the present invention provides a flow-guiding apparatus which is arranged at an air outlet of an axial fan to uniformly distribute the air flow at the air blowing section of the fan. Specifically, the axial fan 200' includes a casing 230' and a rotating hub 210' arranged inside the casing 230', where an outer sidewall of the hub 210' is fixedly arranged with blades 220'.

Figure 3:
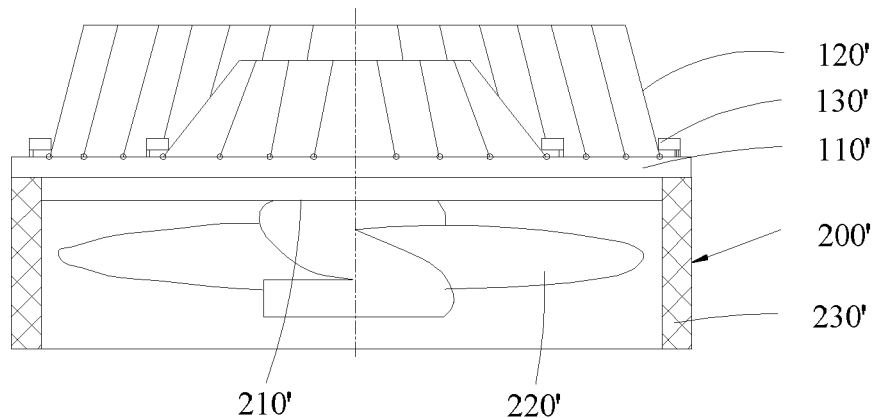
FIG. 3 is a schematic sectional view for assembling a flow-guiding apparatus according to a second embodiment of the present invention with an axial fan.
Figure 4:
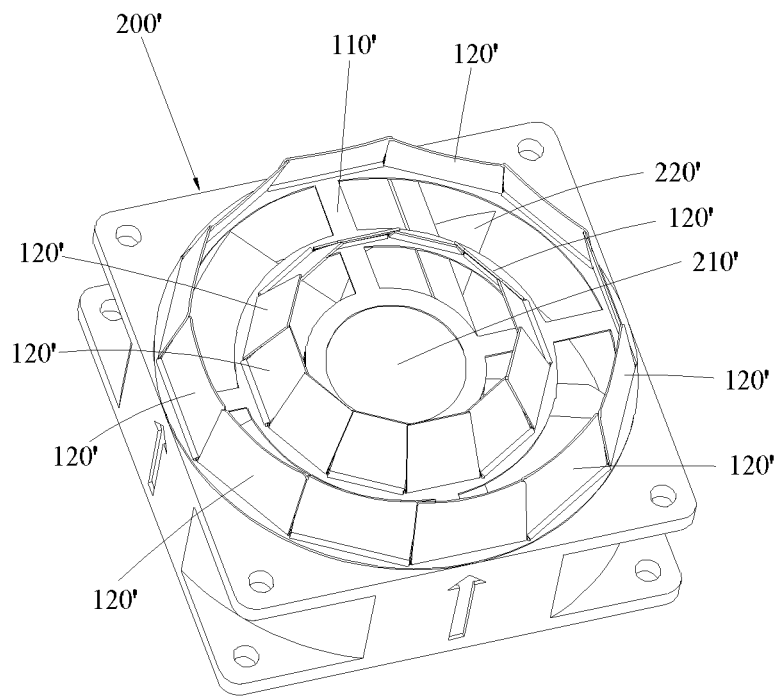
FIG. 4 is a schematic stereoscopic view for assembling a flow-guiding apparatus according to a second embodiment of the present invention with an axial fan.

As shown in FIG. 3 and FIG. 4, the flow-guiding apparatus includes a support 110' and flow-guiding members 120', where the flow-guiding members 120' are used for guiding an air flow generated by the axial fan 200' to an area directed by the flow-guiding members 120'. The flow-guiding members 120' are connected to the support 110'. At least two flow-guiding members 120' are arranged and are located around the hub 210' of the axial fan 200'. The flow-guiding members 120' tilt toward the hub 210' of the axial fan 200' along an air-blowing direction of the axial fan 200', so that the air flow generated by the axial fan 200' is guided by the flow-guiding members 120' to the central area where the original air flow speed is very small, thereby making the air flow from the air blowing section of the whole axial fan 200' be uniformly distributed for excellent heat radiation of components corresponding to the air blowing section of the whole axial fan 200', which overcomes the shortcoming of the prior art. Moreover, because no space for forming a pressure-balancing chamber is required, the distance between the axial fan 200' and the components is set small enough to meet design requirements of an electronic device with a compact structure. By using the flow-guiding apparatus provided by the embodiment of the present invention, the air flow generated by the blades 220' of the axial fan 200' may be guided to an area of the hub 210' of the axial fan 200' where the original air flow is weak, thereby ensuring the heat-radiating performance in the area of the hub 210', preventing the components and a circuit board from partially overheating, further ensuring the working stability of the device, and prolonging the service life of the device.

Figure 5:
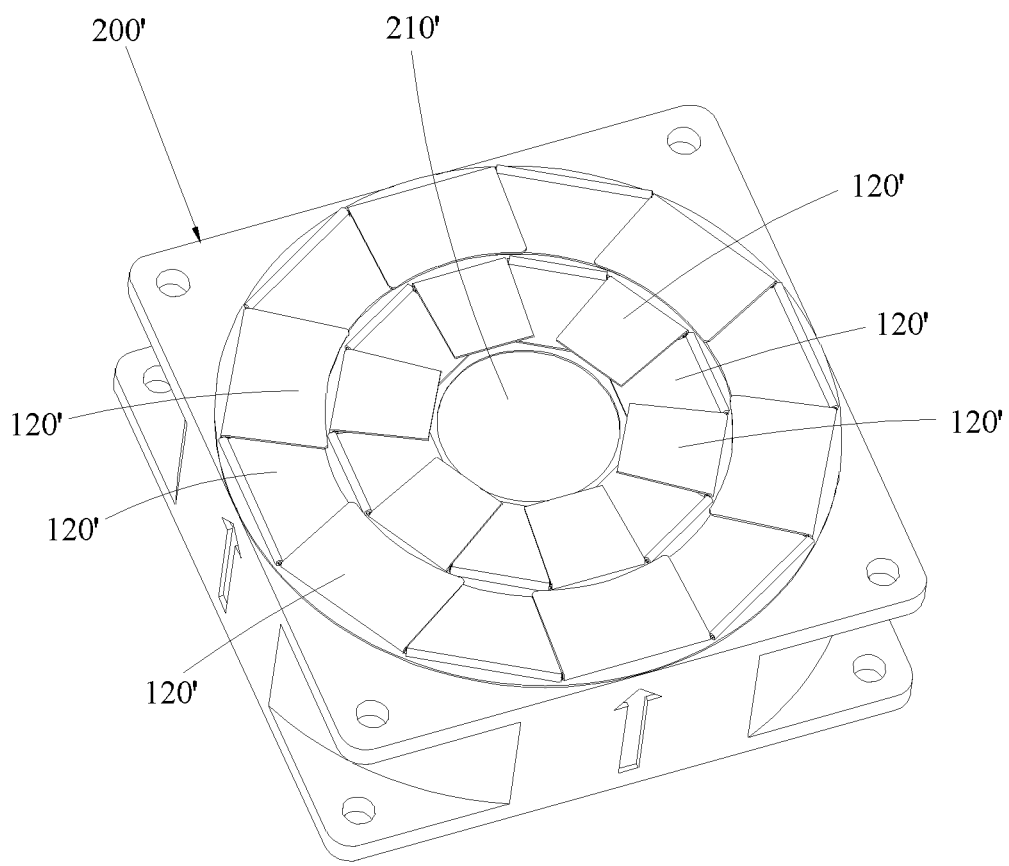
FIG. 5 is a schematic stereoscopic view of flow-guiding members in FIG. 4 when they are closed.

Specifically, as shown in FIG. 3 to FIG. 5, the flow-guiding members 120' are movably hinged to the support 110' and may flip open by action of the axial fan 200'. The support 110' may be integrated on an end surface of the casing 230' of the axial fan 200', and such a case is equivalent to that the flow-guiding members 120' are directly hinged on the casing 230' of the axial fan 200'. Assuredly, the support 110' may also be fitted on the casing 230' of the axial fan 200' by using fasteners, which also falls within the protection scope of the present invention. The flow-guiding members 120' or the support 110' is provided with limiting mechanisms for limiting a maximum turnover angle of the flow-guiding members 120'. A shape and size of the support 110' match a shape and size of the axial fan 200', and the central area of the axial fan 200' overlaps the central area of the support 110'. During operation, the axial fan 200' generates an air flow which flows forward along an axial direction of a shaft of the fan; the flow-guiding members 120' will flip forward to open by action of the air flow; the limiting mechanisms may limit a maximum turnover angle of the flow-guiding members 120'. By arranging the limiting mechanisms in proper positions, the flow-guiding members 120' tilt in a specific angle against the direction of the air flow after turning over to the maximum angle, thereby guiding the air flow to a direction directed by the flow-guiding members 120'. In this embodiment, as shown in FIG. 4, the flow-guiding members 120' are arranged on both sides of a central axis of the axial fan 200', and after turning over to the maximum angle, the flow-guiding members 120' all tilt toward the area of the hub 210' (that is, the central axis of the axial fan 200). As shown in FIG. 5, when the axial fan 200' stops working, because no air flow reaches the flow-guiding members 120' and by action of air pressure inside the device, the flow-guiding members 120' may flip backward and touch the axial fan 200' to block the air blowing section of the axial fan 200'. When two or more axial fans 200' are arranged side by side, if one of the axial fans 200' fails and stops rotating and the air blowing section is not closed, the air flow of other axial fans 200' directly flows out through the air blowing section of the failed axial fan 200', which forms an air flow short pass and seriously affects the heat-radiating effect of the device. In the flow-guiding apparatus provided by the embodiment of the present invention, by hinging the flow-guiding members 120' to the support 110', the air blowing section may be closed when the axial fan 200' stops rotating, thereby preventing a harmful phenomenon of device overheating due to the formation of the air flow short pass, and further ensuring the working reliability of the device.

Specifically, as shown in FIG. 3, the flow-guiding members 120' are hinged around the central area of the support 110'. When the flow-guiding members 120' flip to the maximum turnover angle, the flow-guiding members 120' tilt toward the central area of the support 110' to guide an air flow generated at the area of the blades 220' of the axial fan 200' to the area of the hub 210' of the axial fan 200' where the air flow is weak. In this embodiment, the flow-guiding members 120' are hinged on both sides of the central area, the flow-guiding members 120' on the left side tilt toward right, and the flow-guiding members 120' on the right side tilt toward left, hinge points between the flow-guiding members 120' and the support 110' correspond to middle parts of the blades 220' of the axial fan 200', the flow-guiding members 120' on the two sides may be arranged symmetrically or asymmetrically, and maximum turnover angles of the flow-guiding members 120' in different positions on the two sides may be same or different, which may be flexibly set according to positions and air flow requirements of downstream components.

Alternatively, the flow-guiding members 120' may also be fixedly arranged on or integrated with the support 110', which also has a function of guiding the air flow but cannot prevent the air flow short pass.

Specifically, as shown in FIG. 3, along a radial direction of the support 110', at least two flow-guiding members 120' are arranged, and correspondingly, at least two limiting mechanisms are arranged. The flow-guiding members 120' and the limiting mechanisms may be determined according to actual situations, which shall all fall within the protection scope of the present invention. If components requiring heat radiation are concentrated in an area to the right of the air outlet of the axial fan, both the opening angle of the flow-guiding members 120' and the number of the flow-guiding members 120' on the left side may be decreased, while the opening angles and the number of the flow-guiding members 120' on the right side may be increased, and vice versa. The maximum turnover angle of the flow-guiding members 120' close to the central area of the support 110' is smaller than the maximum turnover angle of the flow-guiding members 120' with a long distance from the central area of the support 110'.

Specifically, as shown in FIG. 3, the limiting mechanisms include limiting bosses 130', where the limiting bosses 130' are fixedly arranged on the support 110' or at bottom parts of the flow-guiding members 120', both of which may have a function of limiting maximum turnover angles of the flow-guiding members 120'. The limiting bosses 130' may be arranged on and protrude from the support 110' or be arranged on and protrude from the bottom parts of the flow-guiding members 120' to reduce assembly steps, and may also be assembled and fixed on the support 110' or be fixed on the bottom parts of the flow-guiding members 120'. In this embodiment, the limiting bosses 130' are fixedly arranged on the support 110'.

Preferably, as shown in FIG. 3, the limiting bosses 130' is made of elastic materials to prevent vibration noise when the flow-guiding members 120' hit the limiting bosses 130' when the flow-guiding members 120' are opened or when the air flow is unstable. In specific applications, the limiting bosses 130' may be made of elastic materials such as rubber. Assuredly, it may be understood that the limiting bosses 130' may also be made of other materials, and may also be integrated with the support, both of which fall within the protection scope of the present invention.

In addition, the limiting mechanisms may be in other proper structures. For example, catch rings for stopping the flow-guiding members 120' may be arranged, or ropes for limiting turnover of the flow-guiding members 120' may be arranged, both of which may implement the position-limiting function.

Specifically, as shown in FIG. 3 to FIG. 5, along the radial direction of the axial fan 200', at least two circles of flow-guiding members 120' are arranged, each circle of flow-guiding members 120' is formed by multiple surrounding flow-guiding members 120' to make a flow-guiding circle. Because each flow-guiding member 120' tilts toward the area of the hub 210', each circle of flow-guiding members 120' is in a form of a round platform. This may guide the air flow to the area down the hub 210' with a good flow-guiding effect. A diameter in a bottom part of each circle of flow-guiding members 120' is big and a diameter in a top part is small, thereby guiding a partial air flow generated by the axial fan 200' to the area of the hub 210'. An opening angle of flow-guiding members 120' with a short distance from the hub 210' of the axial fan 200' is greater than an opening angle of flow-guiding members 120' with a long distance from the hub 210' of the axial fan 200'. Tilt angles of flow-guiding members 120' located in different radial directions are different (in this embodiment, a tilt angle refers to an angle between a flow-guiding member 120' and the support 110'), and tilt angles of flow-guiding members 120' close to the hub 210' are smaller than tilt angles of flow-guiding members 120' far away from the hub 210'. For the axial fan 200', the air flow in an area approaching the hub 210' in the center becomes smaller and smaller, and the air flow in an area approaching tips of the blades 220' becomes bigger and bigger. When the tilt angle of the flow-guiding members 120' with a long distance from the central area is big, the corresponding air flow may be guided to an area directed by the flow-guiding members 120'. The tilt angle of the flow-guiding members 120' close to the central area is smaller in order to guide the corresponding air flow to the central area. By setting a small tilt angle of flow-guiding members 120' close to the hub 210', the air flow of the air blowing section of the whole axial fan 200' is uniformly distributed.

In addition, all the flow-guiding members 120' may be fixed on or integrated with the support 110' to form a fixed flow-guiding circle, which may also have the flow-guiding function but does not have a function of preventing the air flow from flowing back.

More specifically, as shown in FIG. 3 and FIG. 4, two circles of the flow-guiding members 120' are arranged, where an tilt angle of the flow-guiding members 120' in an inner cycle is small, and an tilt angle of the flow-guiding members 120' in an outer circle is big. The flow-guiding members 120' in the outer circle approach top ends of the blades 220' of the axial fan 200', and the flow-guiding members 120' in the inner cycle approach middle parts of the blades 220'. As shown in FIG. 5, when the flow-guiding members 120' are closed, top ends of the flow-guiding members 120' in the outer circle closely touch bottom parts of the flow-guiding members 120' in the inner cycle, and top ends of the flow-guiding members 120' in the inner circle closely touch an outer edge of the hub 210', which fully blocks the air blowing section of the axial fan to produce a good effect of preventing back-flowing.

Embodiments of the present invention further provide an electronic device, where the electronic device may be a computer, a notebook computer, a mobile portable electronic terminal, a computer server, an on-vehicle electronic device, and a communication device. The electronic device includes a chassis, where electronic components and circuit boards are arranged inside the chassis. The chassis is provided with an air vent, an axial fan 200' is arranged at the air vent, and an air outlet of the axial fan 200' is arranged with a flow-guiding apparatus mentioned above. One, two, or more axial fans 200' may be arranged, and correspondingly, one, two, or more flow-guiding apparatuses may be arranged. In this embodiment, the flow-guiding members 120' are arranged on both sides of or around a central axis of the axial fan 200', all the flow-guiding members, after rotating to a maximum angle, tilt toward the central axis of the axial fan 200', and the flow-guiding members 120' are capable of guiding a strong air flow generated by blades 220' of the axial fan 200' to an area of a hub 210' of the axial fan 200' where the original air flow is weak, thereby ensuring the heat-radiating performance of the area of the hub 210' of the axial fan 200', preventing the components and the circuit boards inside the electronic device from partially overheating, further ensuring the working stability of the electronic device, and prolonging the service life of the electronic device. When the axial fan 200' stops working, because no air flow reaches the flow-guiding members 120' and by action of air pressure inside the chassis, the flow-guiding members 120' may automatically return to original positions and touch the axial fan 200' to block an air blowing section of the axial fan 200', thereby preventing the formation of an air flow short pass. In addition, when the electronic device is powered off, the axial fan 200' also stops rotating. In such cases, the flow-guiding members 120' will be timely closed to block the air blowing section of the axial fan 200', which prevents foreign matters from entering the electronic device and produces a high reliability.

The above descriptions are merely exemplary embodiments of the present invention, but are not intended to limit the present invention. Any modifications, equivalent replacements, or improvements made without departing from the spirit and principle of the present invention should fall within the protection scope of the present invention.

What is claimed is:

1. A flow-guiding apparatus, arranged at an air outlet of an axial fan, comprising:

a plurality of radial support from a hub and respective concentric surrounding flow-guiding members which are concentrically-mounted onto the plurality of radial support for guiding an air flow generated by the axial fan to a directed area towards only an axial center and away from the air outlet of the axial fan, a component requiring heat radiation is disposed downstream of the flow-guiding apparatus, wherein the respective concentric surrounding flow-guiding members comprises at least two surrounding inner flow-guiding members and at least two surrounding outer flow-guiding members which are respectively concentrically-mounted onto the plurality of radial support in such a way that both the at least two surrounding inner flow-guiding members and the at least two surrounding outer flow-guiding members only open and tilt in a same direction to guide the generated airflow toward only the axial center of the axial fan along an air-blowing direction of the axial fan, in response to the airflow generated by the axial fan; wherein an opening angle of the at least two surrounding outer flow guiding members ranges between 70° and 90°, and an opening angle of the at least two surrounding inner flow guiding members ranges between 30° and 65°.

2. The flow-guiding apparatus according to claim 1, wherein an opening angle from rest position of the at least two surrounding inner flow-guiding members with a closer distance from the hub of the axial fan is smaller than an opening angle from rest position of the at least two surrounding outer flow-guiding members with a farther distance from the hub of the axial fan.

3. The flow-guiding apparatus according to claim 2, wherein the at least two surrounding outer flow-guiding members are connected to the plurality of radial support at a position closer to a blade tip of the axial fan, the at least two surrounding inner flow-guiding members are connected to the plurality of radial support at a position closer to the middle of a blade of the axial fan; wherein the opening angle which ranges between 70° and 90° is measured from the rest position of the at least two surrounding outer flow guiding members close to the blade tip of the axial fan; and the opening angle which ranges between 30° and 65° is measured from the rest position of the at least two surrounding inner flow guiding members close to the middle of the blade of the axial fan.

4. The flow-guiding apparatus according to claim 1, wherein the at least two surrounding outer flow-guiding members are closer to the blade tips of the axial fan, the at least two surrounding inner flow-guiding members are closer to the middle parts of blades of the axial fan; when closed in rest position, top ends of the at least two surrounding outer flow-guiding members in an outer circle touch bottom of the at least two surrounding inner flow-guiding members in an inner circle, and top ends of the at least two surrounding inner flow-guiding members in the inner circle closely touch an outer edge of the hub of the axial fan.

5. The flow-guiding apparatus according to claim 1, wherein the axial fan comprises a casing and a rotatable hub arranged in the casing, blades are fixedly arranged on an outer sidewall of the hub, and the support is fixedly connected to an end surface of the casing or is integrated with the casing.

6. The flow-guiding apparatus according to claim 1, wherein the respective concentric surrounding flow-guiding members are movably hinged to the plurality of radial support and are able to flip open by action of the airflow generated by the axial fan, and the respective concentric surrounding flow-guiding members or the plurality of radial support are arranged with limiting mechanisms for limiting a maximum turnover angle from rest position of the respective concentric surrounding flow-guiding members.

7. The flow-guiding apparatus according to claim 6, wherein the limiting mechanisms comprise limiting bosses and the limiting bosses are fixedly arranged on the support or on bottom parts of the respective concentric surrounding flow-guiding members.

8. The flow-guiding apparatus according to claim 7, wherein the limiting bosses are made of elastic material.

9. An electronic device, comprising:
a chassis being provided with an air vent, an axial fan being arranged at the air vent, and an air outlet of the axial fan being arranged with a flow-guiding apparatus, wherein the flow-guiding apparatus comprises a plurality of radial support and respective concentric surrounding flow-guiding members which are concentrically-mounted onto the plurality of radial support for guiding an air flow generated by the axial fan to a directed area towards only an axial center and away from the air outlet of the axial fan, a component requiring heat radiation is disposed downstream of the flow-guiding apparatus, the respective concentric surrounding flow-guiding members are connected to the support, at least two flow-guiding members comprises at least two surrounding inner flow-guiding members and at least two surrounding outer flow-guiding members which are respectively concentrically-mounted onto the plurality of radial support extending from a hub of the axial fan or around the hub of the axial fan in such a way that both the at least two surrounding inner flow-guiding members and the at least two surrounding outer flow-guiding members only open and tilt in a same direction to guide the generated airflow toward only the axial center of the axial fan along an air-blowing direction in response to the airflow generated by the axial fan;
wherein an opening angle of the at least two surrounding outer flow guiding members ranges between 70° and 90°, and an opening angle of the at least two surrounding inner flow guiding members ranges between 30° and 65°.

10. The electronic device according to claim 9, wherein the respective concentric surrounding flow-guiding members are movably hinged to the plurality of support and are able to flip open from rest position by action of the airflow generated by the axial fan, and the respective concentric surrounding flow-guiding members or the plurality of support are arranged with limiting mechanisms for limiting a maximum turnover angle of the respective concentric surrounding flow-guiding members.

11. The electronic device according to claim 10, wherein the limiting mechanisms comprise limiting bosses, and the limiting bosses are fixedly arranged on the plurality of support or on bottom ends of the respective concentric surrounding flow-guiding members.

12. The flow-guiding apparatus according to claim 1, two concentric circles of the respective concentric surrounding flow-guiding members are arranged along a radial direction of the axial fan, two respective concentric air outlet areas are formed according to the two concentric circles, wherein an outer air outlet area is surrounded by the at least two surrounding outer flow-guiding members, an inner air outlet area is surrounded by the at least two surrounding inner flow-guiding members.

13. The electronic device according to claim 9, two concentric circles of the respective concentric surrounding flow-guiding members are arranged along a radial direction of the axial fan, two respective concentric air outlet areas are formed according to the two concentric circles, wherein an inner air outlet area is surrounded by an outer air outlet area, wherein the outer air outlet area is surrounded by the at least two surrounding outer flow-guiding members, and the inner air outlet area is surrounded by the at least two surrounding inner flow-guiding members, which air flow from both the inner air outlet area and the outer air outlet area directed towards only the axial center away from the air outlet of the axial fan.

14. The electronic device according to claim 9, wherein the at least two surrounding outer flow-guiding members are connected to the plurality of radial support at the position where close to a blade tip of the axial fan, the at least two surrounding inner flow-guiding members are connected to the plurality of radial support at the position where close to the middle of a blade of the axial fan.

15. The electronic device according to claim 9, wherein the opening angle which ranges between 70° and 90° is measured from the rest position of the at least two surrounding outer flow guiding members close to the blade tip of the axial fan; and the opening angle which ranges between 30° and 65° is measured from the rest position of the at least two surrounding inner flow guiding members close to the middle of the blade of the axial fan.

\* \* \* \* \*